United States Patent
Yamashita

(10) Patent No.: US 6,819,188 B2
(45) Date of Patent: Nov. 16, 2004

(54) PHASE-LOCKED LOOP OSCILLATOR WITH LOOP GAIN COMPENSATION

(75) Inventor: Hideki Yamashita, Hyogo (JP)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/304,584

(22) Filed: Nov. 26, 2002

(65) Prior Publication Data

US 2003/0098745 A1 May 29, 2003

(30) Foreign Application Priority Data

Nov. 26, 2001 (JP) ......................................... 2001-359011

(51) Int. Cl.[7] .............................................. H03L 7/093
(52) U.S. Cl. ............................. 331/17; 331/16; 331/25
(58) Field of Search ................................. 331/8, 10, 16, 331/17, 18, 25; 327/156–159; 332/127; 360/51; 375/376; 455/260

(56) References Cited

U.S. PATENT DOCUMENTS

| 4,568,888 A | 2/1986 | Kimura et al. ................. 331/10 |
| 4,970,472 A | * 11/1990 | Kennedy et al. ................ 331/8 |
| 6,150,857 A | 11/2000 | Blaser ......................... 327/156 |
| 6,285,263 B1 | 9/2001 | Anderson ..................... 331/34 |

\* cited by examiner

*Primary Examiner*—David Mis

(57) ABSTRACT

A phase-locked loop oscillator with loop gain compensation. The phase-locked loop oscillator includes a phase comparator, a loop filter, a voltage-controlled oscillator, a control device, and a variable-gain amplifier disposed between the phase comparator and the loop filter. The oscillator detects the output signal voltage of the loop filter and controls the amplification rate of the variable-gain amplifier so that the loop gain is compensated and held constant, without sacrificing continuity.

10 Claims, 7 Drawing Sheets

PHASE-LOCKED LOOP OSCILLATOR WITH LOOP GAIN COMPENSATION

BACKGROUND OF THE INVENTION

1. Field of the Invention

The present invention generally pertains to an oscillator which uses a PLL, in particular, it concerns a PLL oscillator used in electronic measuring devices which sweep broad frequency bands.

2. Discussion of the Background Art

In general, measurement instruments, such as network analyzers and oscillators that include phase-locked loops, are used to produce signals internally. The term "phase-locked loop" is abbreviated herein below as "PLL," and an oscillator including a PLL is abbreviated as a "PLL oscillator.")

FIG. 1A shows an example of a basic configuration of a PLL oscillator. In FIG. 1A, the PLL oscillator 100 is provided with a standard, signal oscillator 110, a phase comparator 120, a loop filter 130, which is a low-band wave filter, a voltage-controlled oscillator 140, and a divider 150. With reference to PLL oscillator 100 the signals produced by the voltage-controlled oscillator 140 are split by the divider 150. In the phase comparator 120, the phase difference between the split signal and the signal generated by the standard, signal oscillator is detected and a phase difference signal is produced corresponding to the phase difference. The phase difference signal is filtered by the loop filter 130 and input into the voltage-controlled oscillator 140. In this manner a feedback system is formed which acts in such a way that no phase difference is detected by the phase comparator 120. As a result, the voltage-controlled oscillator 140 oscillates synchronously with the standard, signal oscillator 110. Furthermore, by setting the dividing ratio of the divider 150 to a desired value, the voltage-controlled oscillator 140 can be made to oscillate at a desired frequency.

The total gain in one cycle in this feedback system is referred to as the loop gain. The loop gain of a PLL oscillator has important significance for the stability of the system and its response characteristics. For example, if the loop gain is increased, external noise has less effect on the system, and the stability of the feedback system can be increased. However, if the loop gain becomes too large, the internal noise is increased, and the stability of the feedback system is reduced. Therefore, optimization of the loop gain is an important problem in designing PLL oscillators. That is, it is desirable for the loop gain of the PLL oscillator to be constant within its sweep frequency band.

Since the sensitivities of voltage control oscillators are not constant, the loop gain has a characteristic which depends on the oscillating frequency. As the oscillating frequency of the voltage-controlled oscillator 140 becomes higher, its sensitivity decreases markedly. Therefore, the loop gain also decreases. Here, the sensitivity is the oscillation frequency differentiated by the input signal voltage in the voltage-controlled oscillator. Moreover, the splitting ratio of the divider, which is varied in order to produce oscillation of the desired frequency, undergoes greater changes the wider the sweep frequency band of the PLL oscillator becomes. Therefore, the loop gain undergoes still greater changes. An example of the characteristic of the loop gain is shown in FIG. 1B. The vertical axis in FIG. 1B is the loop gain of the PLL oscillator, and the horizontal axis is its oscillation frequency.

As mentioned above, it is desirable for the loop gain of a PLL oscillator to be constant within its sweep frequency band. In the prior art, therefore, a nonlinear circuit is inserted into the feedback loop in order to compensate for changes in the loop gain due to the sensitivity curve of the voltage-controlled oscillator and the splitting ratio. FIG. 2A shows the make-up of a PLL oscillator which compensates for the loop gain by using a non-linear circuit 260. In FIG. 2A, the PLL oscillator 200 is provided with a standard, signal oscillator 210, a phase comparator 220, a loop filter 230 that is a low-band wave filter, a voltage-controlled oscillator 240, a divider 250, and a non-linear circuit 260. FIG. 2A differs from FIG. 1A in that after the phase difference signal is filtered by the loop filter 230, it passes through the non-linear circuit 260 before it is input into the voltage-controlled oscillator 240. Its operation is the same as that of the PLL oscillator shown in FIG. 1A, and the voltage-controlled oscillator 240 oscillates synchronously with the standard, signal oscillator 210.

The non-linear circuit 260 is one in which the output voltage varies in a broken-line manner as a function of the input voltage. FIG. 2B shows the characteristic of the output signal with respect to the input signal in the non-linear circuit 260. Furthermore, the vertical and horizontal axes in FIG. 2B are the input and output signals in the non-linear circuit. The rate of change of the output signal with respect to the input signal, i.e., the differential gain, is shown in FIG. 2C. The horizontal and vertical axes in FIG. 2C are the input signal and the differential gain in the non-linear circuit 260. The non-linear circuit 260 has 2 breaking points, as shown in FIG. 2B. Therefore, the differential gain changes twice, in a step-wise manner, as shown in FIG. 2C.

The changes in the loop gain in the sweep frequency of the PLL oscillator 200 are compensated in such a way that they are contained within a constant range. FIG. 2D shows the characteristic of the compensated loop gain. The vertical axis in FIG. 2D is the loop gain of the PLL oscillator 200 and the horizontal axis is the oscillation frequency of the PLL oscillator 200. Since the differential gain varies in a step-wise manner in this non-linear circuit 260, the loop gain varies discontinuously. The non-linear circuit is formed in such a way that the steps in the differential gain in FIG. 2C become small so that the changes in the loop gain in FIG. 2D are made as smooth as possible, resulting in the nonlinear circuit being made more complex.

Even though the non-linear circuit 260 is formed in such a way that the steps in the differential gain are made small, the discontinuities in the loop gain are not eliminated. Therefore, especially when frequencies are swept, problems such as instability in the behavior of the feedback system arise. For example, when two PLL oscillators are made to sweep frequencies while a constant frequency difference is maintained, their oscillation frequencies do not actually change synchronously and the frequency difference between them is not strictly constant. Therefore, it is desirable to provide a PLL oscillator with a compensation function, such that the loop gain becomes constant without sacrificing continuity.

The present invention solves the problems in the prior art described above by compensating for changes in the loop gain such that the loop gain becomes constant, without sacrificing continuity, by providing a variable-gain amplifier in the loop of the PLL oscillator and by compensating the signal voltage input into the voltage-controlled oscillator.

SUMMARY OF THE INVENTION

A phase-locked loop oscillator, PLL, provided with a phase comparator, a wave filter, and a voltage-controlled oscillator that oscillates synchronously with a standard signal. The phase-locked loop oscillator is provided with a variable-gain amplifier the amplification rate of which can be controlled by a control device. The PLL detects signals in the loops by means of the control device and controls the variable-gain amplifier and compensates for the loop gain.

The control device controls the amplification rate of the variable-gain amplifier based on signals detected between the wave filter (e.g., loop filter) and the voltage-controlled oscillator.

The variable-gain amplifier is placed between the aforementioned phase comparator and the aforementioned wave filter.

DETAILED DESCRIPTION OF THE INVENTION

The present invention will be explained below on the basis of a working example shown in the appended drawings. This working example is a network analyzer, the configuration of which is shown in FIG. 3.

Figure 3:
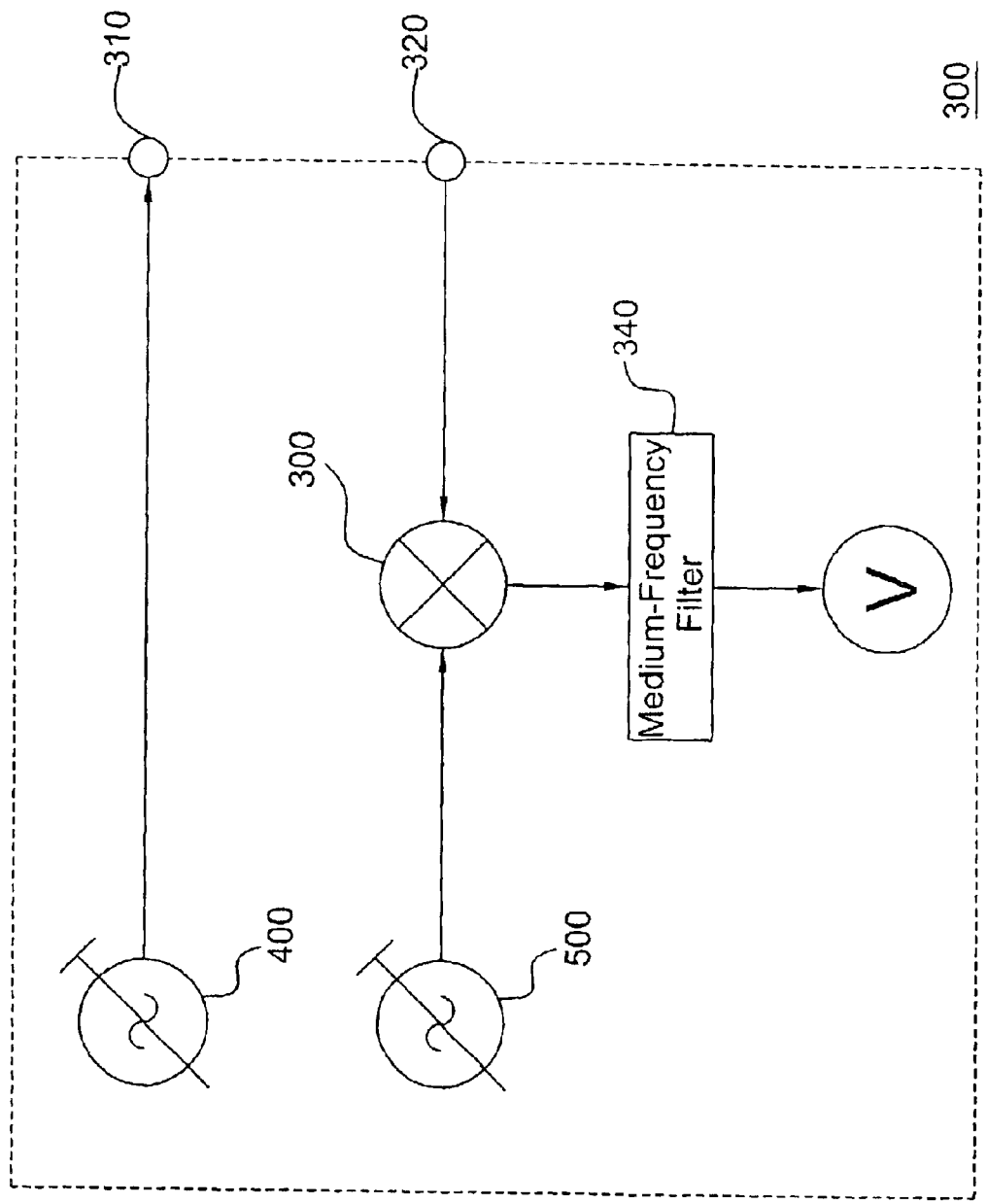
FIG. 3 is a drawing showing the configuration of a network analyzer which is an example of the present invention.

In FIG. 3, the network analyzer 300 is provided with an output terminal 310, an input terminal 320, frequency sweep oscillators 400 and 500, a mixer 330, a medium-frequency filter 340, and a vector voltmeter 350. The object of measurement D, which is not shown in the drawing, is connected between the output terminal 310 and the input terminal 320.

The frequency sweep oscillators 400 and 500 have the same make-up; they are connected to the output terminal 310 and the mixer 330 and output their signals to them.

The mixer 330 is connected to the input terminal 320, the frequency sweep oscillator 500, and the medium-frequency filter 340; it mixes the signals from the input terminal 320 and the frequency sweep oscillator 500 and outputs the result to the medium-frequency filter 340.

The medium-frequency filter 340 is a band pass filter which is connected to the mixer 330 and the vector voltmeter 350; it filters the signals from the mixer 330 and outputs them to the vector voltmeter 350.

The vector voltmeter 350 is connected to the medium-frequency filter 340 and measures the phase shifts and amplitude of the output signal from the mixer 330, filtered by the medium-frequency filter 340.

The frequency sweep oscillators 400 and 500 will now be explained in more detail. Since these devices have the same make-up, the make-up of the frequency sweep oscillator 400 will be explained with reference to FIG. 4.

Figure 4A:
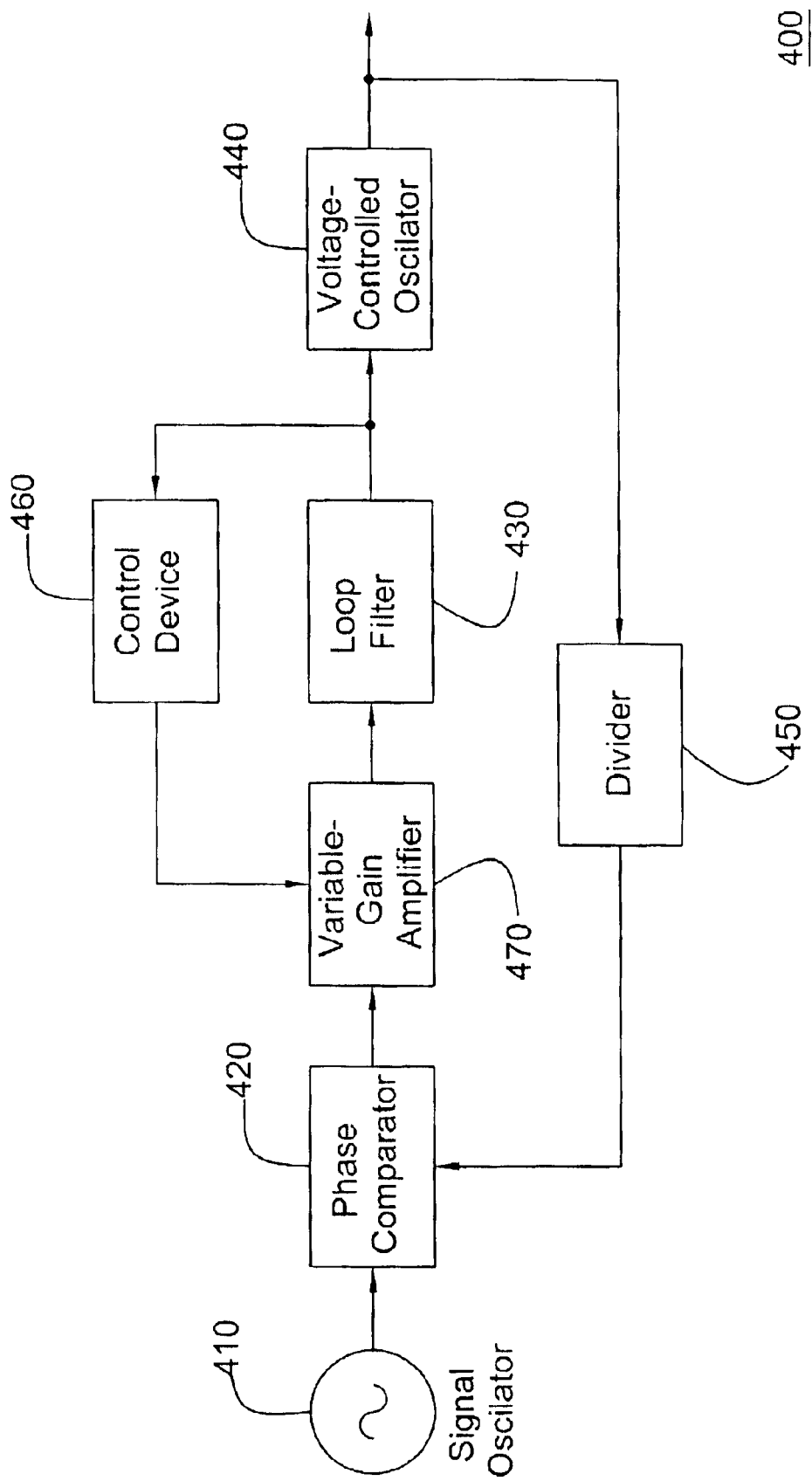
FIG. 4A is a drawing showing an exemplary configuration of the PLL oscillator of the present invention.

In FIG. 4, the frequency sweep oscillator 400 is provided with a standard, signal oscillator 410, a phase comparator 420, a loop filter 430, which is an example of a wave filter, a voltage-controlled oscillator 440, which is an example of an oscillator, a divider 450, a control device 460, and a variable-gain amplifier 470, which is an example of a variable-gain amplifier.

The standard, signal oscillator 410 is connected to the phase comparator 420; it generates a signal with a constant frequency and outputs it to the phase comparator 420.

The phase comparator 420 is connected to the standard signal oscillator 410, the divider 450, and the variable-gain amplifier 470; it detects the phase difference between the output signal from the standard signal oscillator 410 and the output signal from the divider 450 and outputs the phase difference signal to the variable-gain amplifier 470.

The variable-gain amplifier 470 is a voltage-control variable-gain amplifier which is connected to the phase comparator 420, the loop filter 430, and the control device 460; it amplifies the phase difference signal output from the phase comparator 420 and outputs it to the loop filter 430. Furthermore, the amplification rate of the variable-phase amplifier 470 varies linearly with the size of the control voltage produced by the control device 460.

The loop filter 430 is a low-band wave filter which is connected to the variable-gain amplifier 470 and the voltage-controlled oscillator 440; it filters the phase difference signal output from the variable-gain amplifier 470 and outputs it to the voltage-controlled oscillator 440. The output signal of the loop filter is an almost direct-current signal.

The voltage-controlled oscillator 440 is connected to the loop filter 430 and the divider 450; it is a signal source which has a variable oscillation frequency, according to the instantaneous voltage value of the signal output from the loop filter 430. The signal produced by the voltage-controlled oscillator 440 is output to the divider 450. Furthermore, this signal is also the output signal of the frequency sweep oscillator 400.

The divider 450 is connected to the voltage-controlled oscillator 440 and the phase comparator 420; it splits the signal output from the voltage-controlled oscillator 440 and outputs it to the phase comparator 420.

Figure 1A:
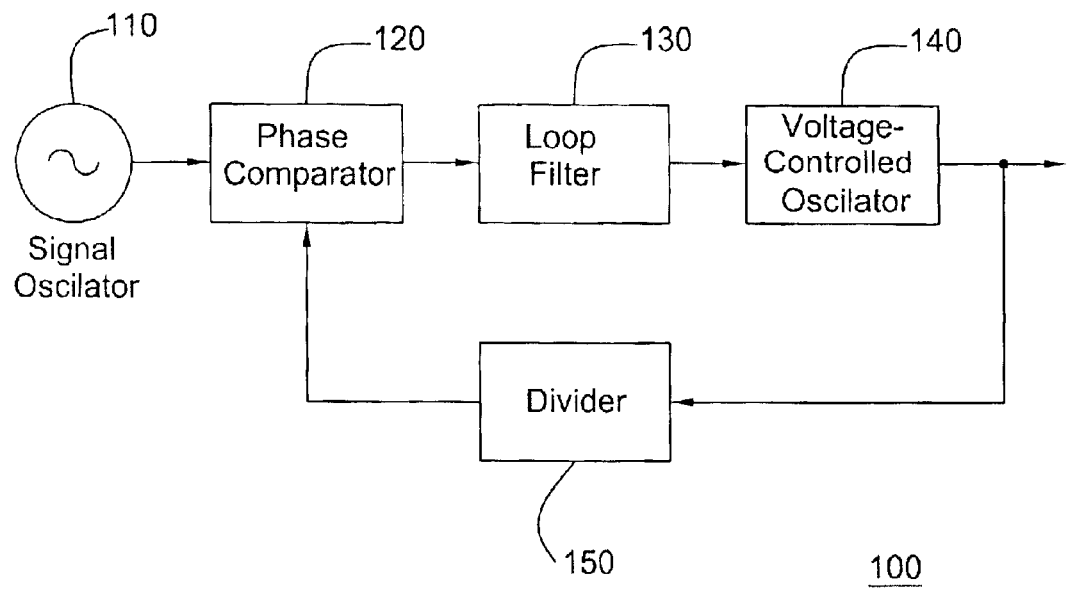
FIG. 1A is a drawing showing a basic configuration of a PLL of the prior art.
Figure 1B:
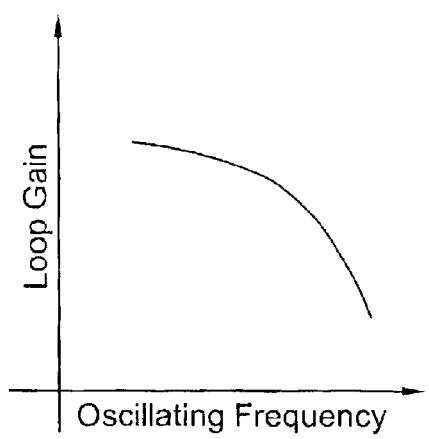
FIG. 1B is a drawing showing an example of the frequency dependence characteristic of the loop gain in a PLL oscillator.
Figure 4B:
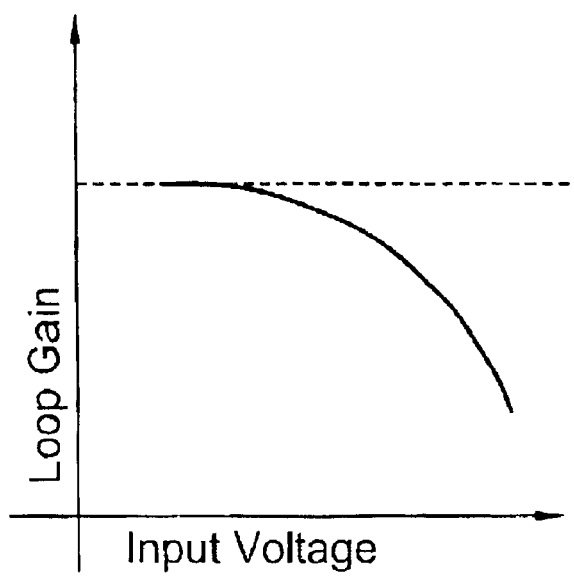
FIG. 4B is a drawing showing the loop gain characteristic in the PLL oscillator of the present invention when the amplification rate of the variable-gain amplifier is set at 1.
Figure 4C:
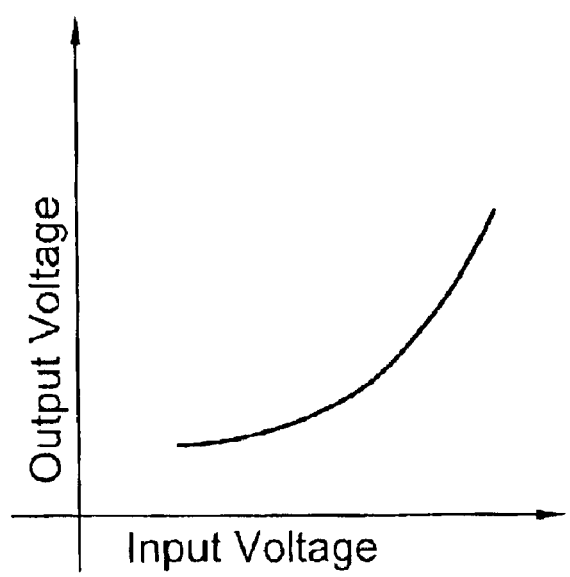
FIG. 4C is a drawing showing the ideal output voltage characteristic of the control device in the PLL oscillator of the present invention.

The control device 460 is connected to the loop filter 430 and the variable-gain amplifier 470; it produces a control voltage which corresponds to the instantaneous voltage value of the signal output from the loop filter 430 and applies this control voltage to the variable-gain amplifier 470. The control device 460 also produces a control voltage for compensating in order to keep the loop gain of the voltage-controlled oscillator 440 constant in the sweep frequency band of the frequency sweep oscillator 400. The characteristic of the output voltage with respect to the input voltage in the control device 460 is as follows. First, in this working example, the characteristic of the loop gain when the amplification rate of the variable-gain amplifier 470 is set at 1 is shown in FIG. 1B. In FIG. 1B, the horizontal axis shows the frequency of the output signal of the voltage-controlled oscillator 440; FIG. 4B shows the characteristic of the loop gain with respect to the instantaneous voltage value of the signal input to the voltage-controlled oscillator 440. IIn FIG. 4B, the solid line shows the characteristic of the loop gain, and the dotted line shows the maximum of the peak gain in the sweep frequency band of the frequency sweep oscillator 400. The variable-gain amplifier 470 amplifies the phase difference signal output from the phase comparator 420, so that the difference between the solid and dotted lines is compensated. The amplification rate of the variable-gain amplifier 470 varies linearly with the size of the control voltage produced by the control device 460; thus, the characteristic of the output voltage with respect to the input voltage in the control device 460 is an ideal one, as shown in FIG. 4C.

Figure 5A:
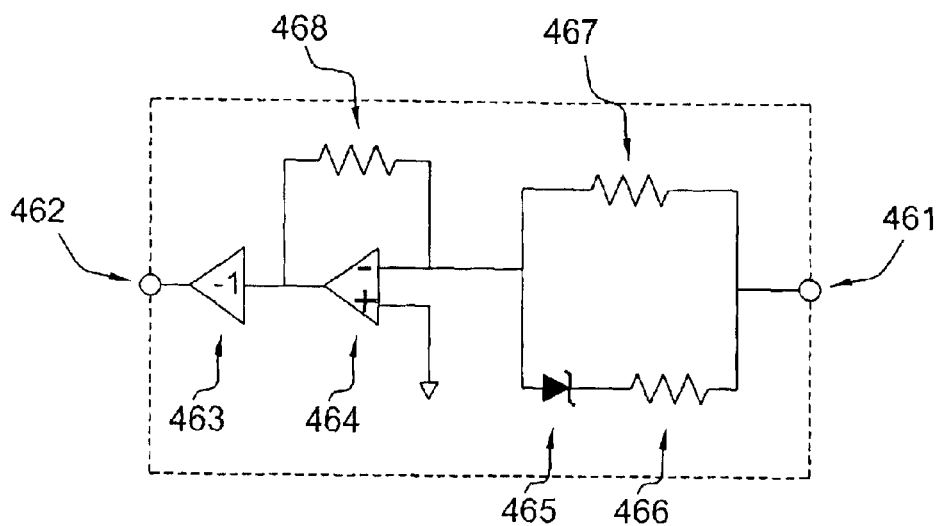
FIG. 5A is a drawing showing the make-up of the control device in the PLL oscillator of this working example.

FIG. 5 shows the inner make-up of the control device 460, in which this kind of characteristic is pseudo-realized. In FIG. 5, the control device 460 is provided with an input terminal 461, and output terminal 462, a reverse amplifier 463 with an amplification rate of −1, a calculating amplifier 464, a constant-voltage diode 465, and resistors 466, 467, and 468.

The series circuit between the resistor 466 and the constant-voltage diode 465 and the resistor 467 are placed in parallel between the negative input of the calculating amplifier 464 and the input terminal 461. The anode of the constant-voltage diode 465 is also connected to the negative input of the calculating amplifier 464. The positive input terminal of the calculating amplifier 464 is grounded. The resistor 468 is placed between the output terminal and the negative input terminal of the calculating amplifier 464. The reverse amplifier 463 is placed between the output terminal of the calculating amplifier 464 and the output terminal 462. The reverse amplifier 463 reverses the output of the calculating amplifier 464 and outputs it to the output terminal 462.

Since the control device 460 is constructed as described above, it acts as a non-linear circuit with one breaking point. Specifically, if the voltage $V_1$ input into the input terminal 461 is less than $V_{th}$, a signal flows to the resistors 466 and 468, so that an output voltage $V_0$ is obtained, as shown by the formula below. Here, R1, R2, and R3 are the resistances of the resistors 466, 467, and 468, and $V_{th}$ is the Zener voltage of the constant-voltage diode 465.

$$V_0 = (R_3/R_2)V_1 \quad \text{[Eq. 1]}$$

If the voltage $V_1$ input into the input terminal 461 is equal to or greater than $V_{th}$, a signal flows to resistances 466, 467, and 468, so that an output voltage $V_0$, shown by the following formula, is obtained.

$$V_0 = [(R_1+R_2)R_3V_1 - R_2R_3V_{th}]/R_1R_2 \quad \text{[Eq. 2]}$$

Figure 5B:
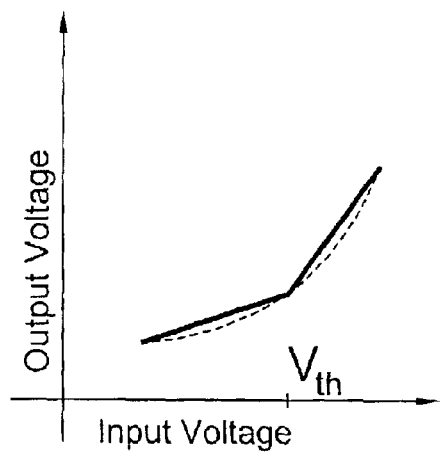
FIG. 5B is a drawing showing the actual characteristic of the output voltage of the control device in the PLL oscillator of the present invention.

If $R_1$, $R_2$, $R_3$, and Vth are selected suitably, the characteristic shown in FIG. 4C can be pseudo-realized. This characteristic is shown in FIG. 5B. In FIG. 5B, the solid line shows the characteristic of the control device 460 and the dotted line shows the ideal characteristic, which was shown in FIG. 4C.

Since the frequency sweep oscillator 400 is constructed in this manner, a feedback system is formed in the phase comparator 420 such that no phase difference is detected, and the voltage-controlled oscillator 440 oscillates synchronously with the standard, signal oscillator 410. Furthermore, the voltage-controlled oscillator can be made to oscillate at the desired frequency by setting the value of the splitting ratio of the divider 450 to a specific value.

Furthermore, because the control device 460 detects the signal input into the voltage-controlled oscillator 440 and feeds it back to the variable-gain amplifier 470, the gain of the variable-gain amplifier 470 varies in such a way that the loop gain, which varies in dependence on the frequency, is compensated. The loop gain of the voltage-controlled oscillator 440 is compensated by this variation in the gain in such a way that it is held constant. This characteristic of the loop gain is shown in FIG. 6.

Figure 2A:
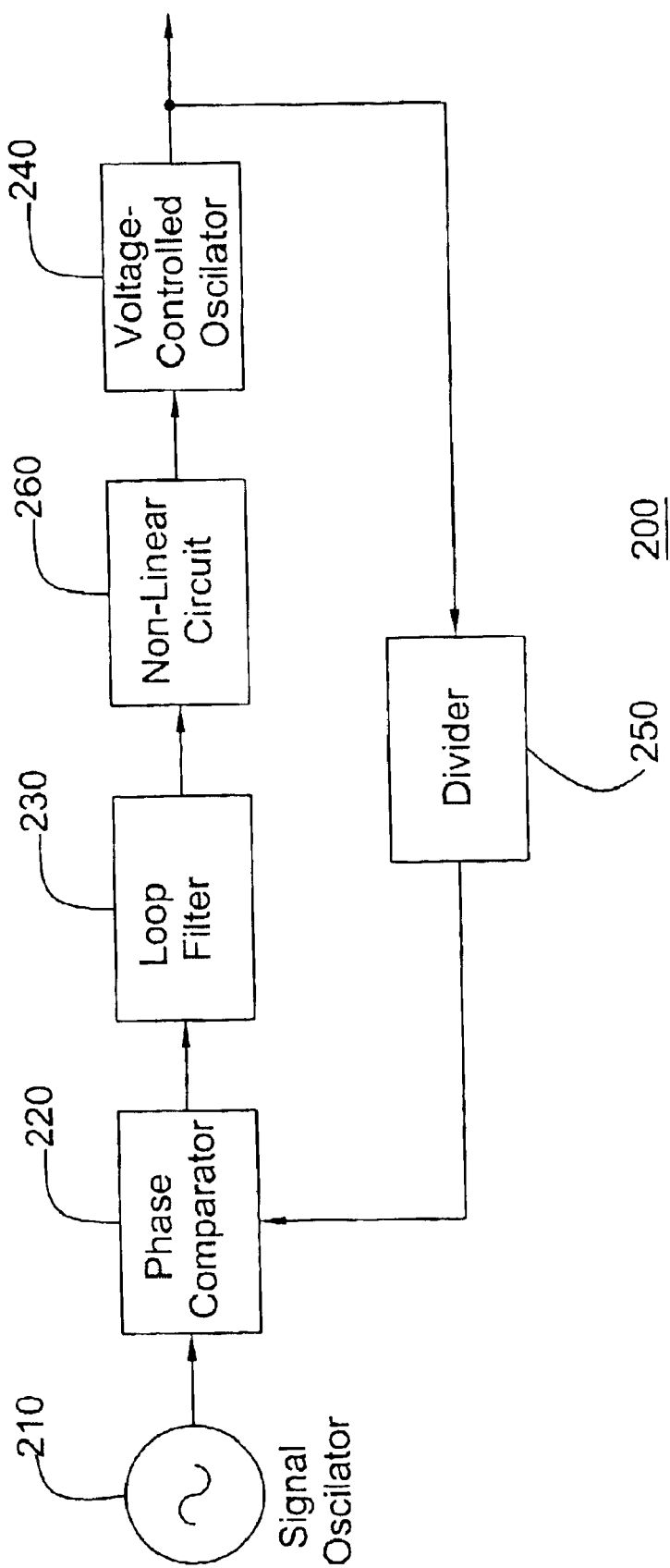
FIG. 2A is a drawing showing the configuration of a PLL oscillator of the prior art in which the loop gain is compensated by means of a non-linear circuit.
Figure 2B:
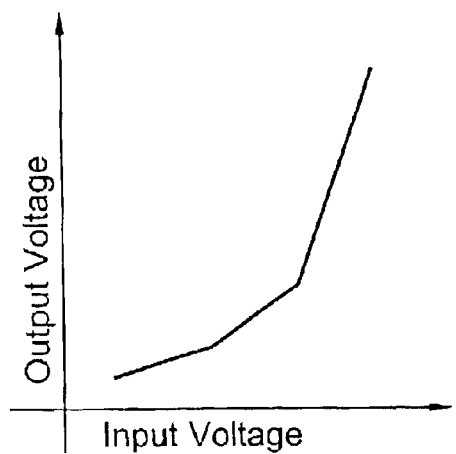
FIG. 2B is a drawing showing the output voltage characteristic of the nonlinear circuit in a PLL oscillator of the prior art in which the loop gain is compensated by means of a non-linear circuit.
Figure 2C:
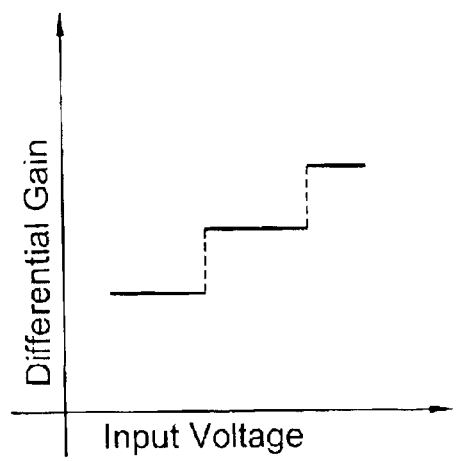
FIG. 2C is a drawing showing the differential gain characteristic of the non-linear circuit in a PLL oscillator of the prior art in which the loop gain is compensated by means of a non-linear circuit.
Figure 2D:
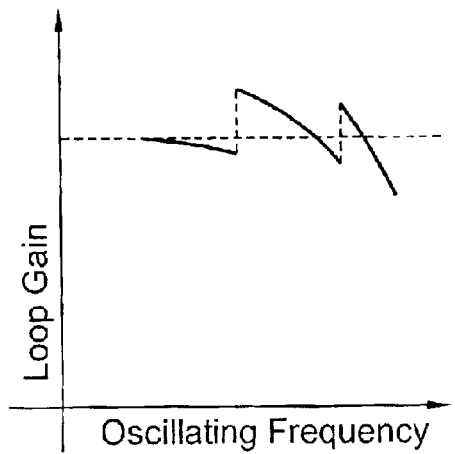
FIG. 2D is a drawing showing the loop gain characteristic of a PLL oscillator of the prior art in which compensation is performed by means of a non-linear circuit.
Figure 6:
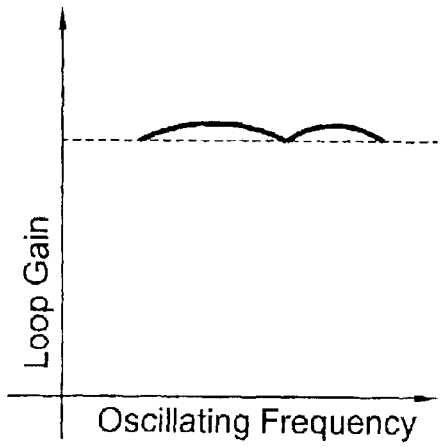
FIG. 6 is a drawing showing the loop gain characteristic of the PLL oscillator of the present invention, which is compensated by the control device and the variable-gain amplifier.

In FIG. 6, the loop gain has no points of discontinuity, compared with that of FIG. 2D, and the amplitude of variation of the loop gain is also small.

It is also possible to use a device in which the variable-gain amplifier is controlled by the current and the control device causes the output current to vary according to the input voltage.

Furthermore, if the level transformer has the function of transforming the signal level in a loop, the variable-gain amplifier of this invention may also be another kind of transforming device. For example, it may be a variable attenuator, or a combination of a fixed amplifier and a variable attenuator.

In addition, the control device may also be replaced by other devices, as long as the characteristic of the output voltage with respect to the input voltage is continuous and it has a property of being able to compensate for the loop gain of the frequency sweep oscillator. For example, it may be an amplifier in which the output voltage varies as a second-order function of the input voltage. Since the network analyzer 300 has the configuration described above, the oscillation frequencies of the frequency sweep oscillators 400 and 500 can be varied synchronously with each other when they are made to sweep frequencies at the same time. Therefore, when the output terminal 310 and the input terminal 320 have been short-circuited, two signals with a stable interrelationship are input to the mixer 340 during the measurement, so that a mixed signal with no unnecessary spurious components can be output. Moreover, since the measurements can be performed without detecting unnecessary signals in the vector voltmeter 350 connected after the medium-frequency filter, the properties of the object of measurement D can be measured with great accuracy when this object D is connected between the output terminal 310 and the input terminal 320.

As explained in detail above, since this invention is constructed and operates as described above, a variable-gain amplifier is provided in the loop of the PLL oscillator and the variable component in the PLL, the sensitivity of which varies with the oscillating frequency, is compensated; therefore, the loop gain can be held constant without sacrificing continuity.

What is claimed is:

1. A phase-locked loop oscillator comprising:
   a phase comparator;
   a filter;

a voltage-controlled oscillator; and a variable-gain amplifier, disposed between the phase comparator and the filter, having a gain that changes non-linearly in response to a control signal input to the voltage-controlled oscillator, wherein a loop gain for the phase-locked loop oscillator is kept constant by the gain changing non-linearly.

2. A phase-locked loop oscillator in accordance with claim 1, wherein the gain changes in a broke-line manner in response to an amplitude of an input signal of the voltage-controlled oscillator.

3. A phase-locked loop oscillator in accordance with claim 1, further comprising a frequency divider.

4. An electronic measuring device comprising a plurality of phase-locked loop oscillators that oscillate synchronously with a standard signal, each said phase-locked loop oscillators comprising:

a phase comparator;

a filter;

a voltage control oscillator;

a variable-gain amplifier disposed between said phase comparator and said filter capable of having its gain controlled; and a control device for controlling said gain of said variable-gain amplifier based on an output signal voltage detected between said filter and said voltage control oscillator.

5. The device in accordance with claim 4, wherein said control device converts said detected output signal voltage to desired voltages or currents, corresponding to said detected output signal voltage level, and said desired voltages or currents set said gain of said variable-gain amplifier so as to keep a loop gain constant in a sweep frequency band.

6. The device in accordance with claim 4, wherein said control device comprises a non-linear circuit that varies in a broken-line manner in response to said detected output signal voltage.

7. The device in accordance with claim 4 wherein said phase-locked loop oscillator further comprises a divider.

8. An electronic measuring device having at least one phase-locked loop oscillator, said phase-locked loop oscillator comprising:

a phase comparator;

a filter;

a voltage-controlled oscillator; and a variable-gain amplifier, disposed between the phase comparator and the filter, having a gain that changes non-linearly in response to a control signal input to the voltage-controlled oscillator, wherein a loop gain for the phase-locked oscillator is kept constant by the gain changing non-linearly.

9. An electronic measuring device of claim 8, wherein the gain changes in a broke-line manner in response to an amplitude of an input signal of the voltage-controlled oscillator.

10. An electronic measuring device of claim 8, wherein the phase-locked loop oscillator further comprises a frequency divider.

* * * * *